(12) United States Patent
Kobayashi

(10) Patent No.: US 10,663,511 B2
(45) Date of Patent: May 26, 2020

(54) SUBSTRATE MOUNTING TABLE AND SUBSTRATE INSPECTION APPARATUS

(71) Applicant: TOKYO ELECTRON LIMITED, Tokyo (JP)

(72) Inventor: Dai Kobayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 21 days.

(21) Appl. No.: 16/033,827

(22) Filed: Jul. 12, 2018

(65) Prior Publication Data

US 2019/0025370 A1 Jan. 24, 2019

(30) Foreign Application Priority Data

Jul. 20, 2017 (JP) ................................. 2017-141220

(51) Int. Cl.
*G01R 31/28* (2006.01)

(52) U.S. Cl.
CPC ...... *G01R 31/2877* (2013.01); *G01R 31/2886* (2013.01)

(58) Field of Classification Search
CPC ............................ G01R 1/07314; G01R 31/02
USPC ....................... 324/756.03, 500, 537, 756.01
See application file for complete search history.

(56) References Cited

U.S. PATENT DOCUMENTS

| | | | | |
|---|---|---|---|---|
| 6,763,157 | B1 * | 7/2004 | Williams | G02B 6/43 385/15 |
| 6,941,034 | B2 * | 9/2005 | Kuboi | G02B 6/3582 385/17 |
| 7,379,641 | B1 * | 5/2008 | Johnson | G02B 6/4222 385/115 |
| 2005/0263247 | A1 * | 12/2005 | Samukawa | G01R 31/1263 156/345.24 |
| 2013/0154675 | A1 * | 6/2013 | Miyazaki | G01N 21/9501 324/750.01 |
| 2013/0308286 | A1 * | 11/2013 | Horie | H05K 1/0268 361/767 |

FOREIGN PATENT DOCUMENTS

| | | |
|---|---|---|
| JP | 2009-512224 A | 3/2009 |
| JP | 2014175491 A | 9/2014 |
| JP | 2017-037721 A | 2/2017 |
| KR | 10-2016-0049069 A | 5/2016 |

* cited by examiner

*Primary Examiner* — Giovanni Astacio-Oquendo

(74) *Attorney, Agent, or Firm* — Nath, Goldberg & Meyer; Jerald L. Meyer

(57) ABSTRACT

A substrate mounting table, which is used for an electrical characteristics inspection of a semiconductor device formed on a substrate, includes a plurality of layers partitioned in a direction perpendicular to a mounting surface on which the substrate is mounted, wherein coolant paths are formed on at least two layers among the plurality of layers, each of the coolant paths having an inlet port and an outlet port located in a circumferential portion of a corresponding one of the at least two layers.

8 Claims, 8 Drawing Sheets

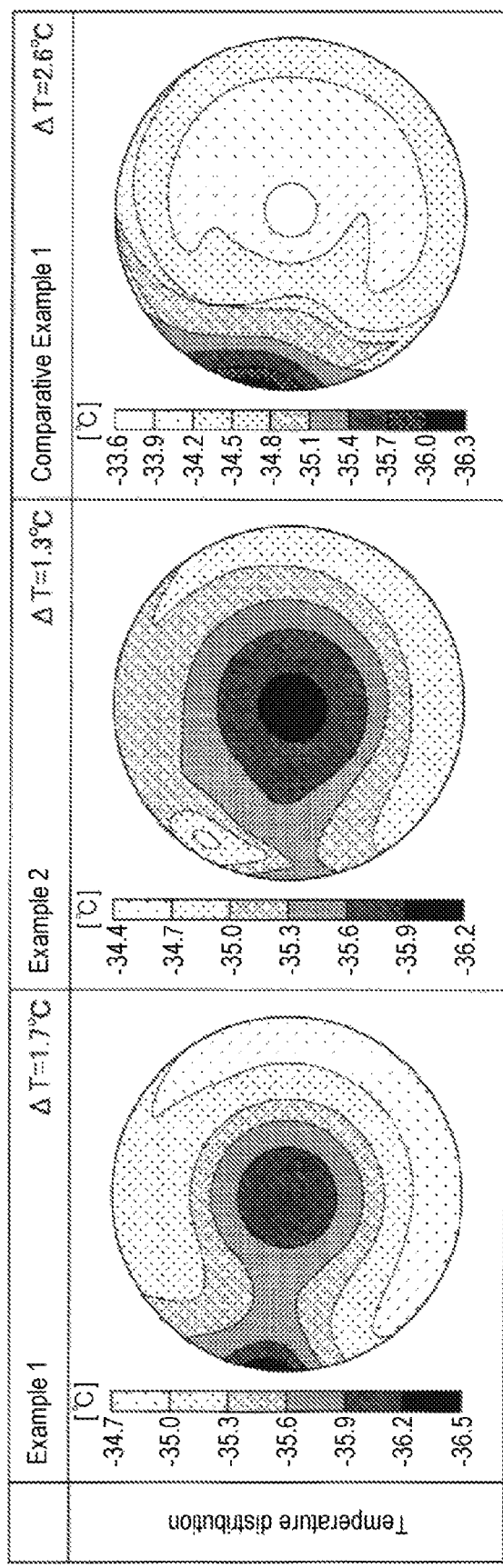

SUBSTRATE MOUNTING TABLE AND SUBSTRATE INSPECTION APPARATUS

CROSS-REFERENCE TO RELATED APPLICATION

This application is based upon and claims the benefit of priority from Japanese Patent Application No. 2017-141220, filed on Jul. 20, 2017, the entire contents of which are incorporated herein by reference.

TECHNICAL FIELD

The present disclosure relates to a substrate mounting table and a substrate inspection apparatus.

BACKGROUND

A substrate inspection apparatus has been used for inspecting electrical characteristics of a semiconductor device formed on a wafer mounted on a substrate mounting table by supplying an electric current from a tester to the semiconductor device via a probe or the like. In some cases while inspecting a semiconductor device using the substrate inspection apparatus, a so-called batch contact test, in which electrical characteristics of a large number of semiconductor devices are simultaneously inspected by bringing probes into contact with the semiconductor devices formed on a wafer in batch, may be conducted.

However, in the batch contact test, a heat generation amount of the wafer may be, for example, about 300 W, which is larger as compared with a case where the individual semiconductor devices are sequentially inspected. As a result, an excessive amount of heat may be applied to the wafer, which may make it difficult to inspect the wafer at a desired temperature. For this reason, a substrate mounting table has been used that is provided with a coolant path circulating a coolant to absorb heat generated by the wafer.

However, in the above-described substrate mounting table, since the coolant path is formed in a spiral shape from a central portion to a circumferential portion of the substrate mounting table, it is likely that the central portion as an upstream side of a coolant flow is cooled further than the circumferential portion as a downstream side of the coolant flow. Therefore, it is likely that a temperature difference is generated between the central portion and the circumferential portion in a mounting surface of the substrate mounting table.

SUMMARY

Some embodiments of the present disclosure provide a substrate mounting table which is capable of enhancing an in-plane temperature uniformity.

According to one embodiment of the present disclosure, a substrate mounting table that is used for an electrical characteristics inspection of a semiconductor device formed on a substrate includes a plurality of layers partitioned in a direction perpendicular to a mounting surface on which the substrate is mounted. Coolant paths are formed on at least two layers among the plurality of layers, each of the coolant paths having an inlet port and an outlet port located in a circumferential portion of a corresponding one of the at least two layers.

According to one embodiment of the present disclosure, a substrate inspection apparatus that inspects electrical characteristics of a semiconductor device formed on a substrate includes: a substrate mounting table on which the substrate is mounted; and a probe card facing a mounting surface of the substrate mounting table, on which the substrate is mounted, and having a number of probes configured to be in an electrical contact with the semiconductor device. The substrate mounting table includes a plurality of layers partitioned in a direction perpendicular to the mounting surface. Coolant paths are formed on at least two layers among the plurality of layers, each of the coolant paths having an inlet port and an outlet port located in a circumferential portion of a corresponding one of the at least two layers.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 10 shows simulation results of an in-plane temperature distribution of a mounting surface.

DETAILED DESCRIPTION

Figure 1:
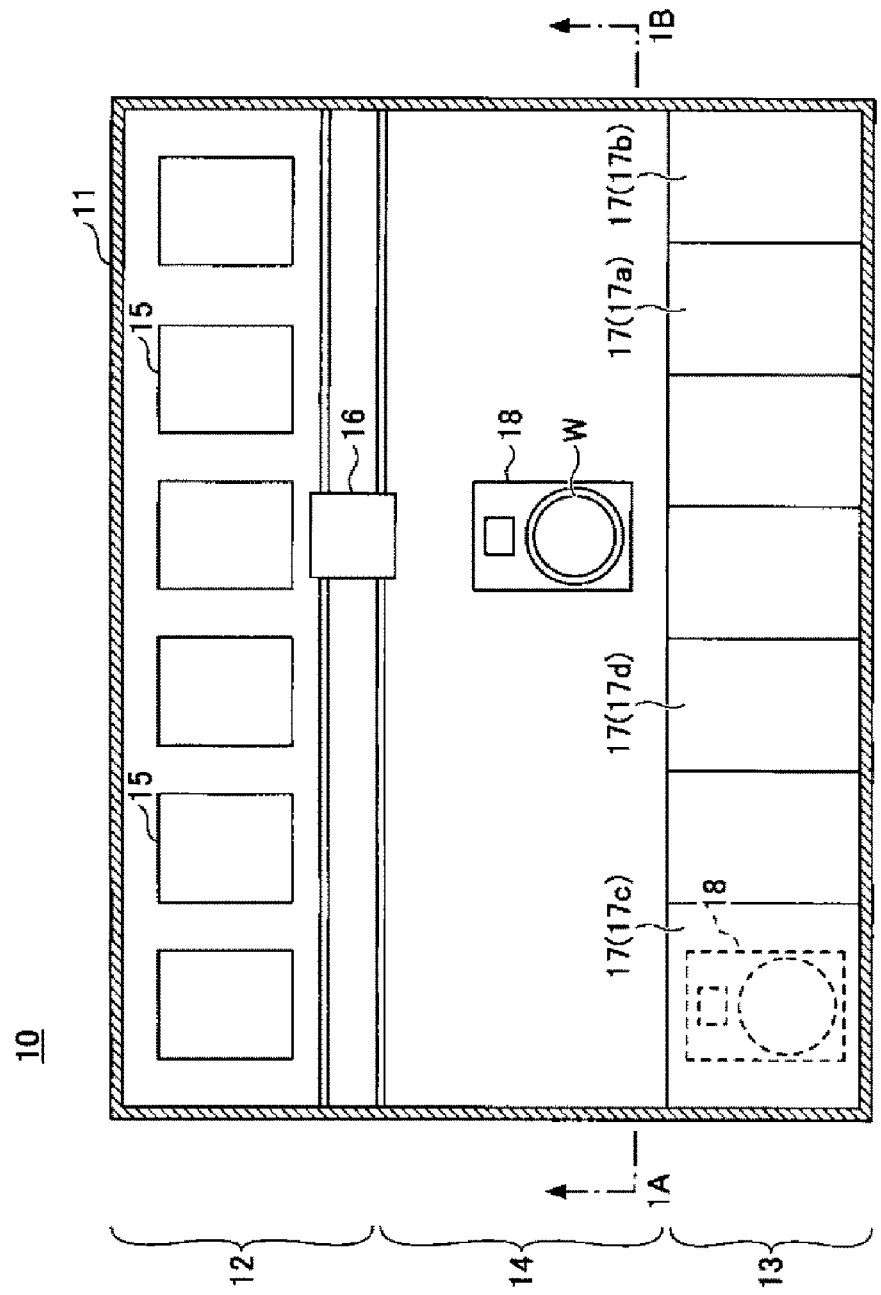
FIG. 1 is a schematic view of a substrate inspection apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Throughout the specification and the drawings, the same or similar elements and parts are denoted by the same reference numerals and explanation thereof will not be repeated.

[Substrate Inspection Apparatus]

A substrate inspection apparatus according to an embodiment of the present disclosure will now be described. The substrate inspection apparatus according to the embodiment of the present disclosure is an apparatus provided with a plurality of cells, each of which is capable of independently inspecting a semiconductor wafer (hereinafter, simply referred to as a "wafer") as a substrate at the same time. However, the substrate inspection apparatus is not limited thereto, but may be, for example, an apparatus that inspects a single wafer.

Figure 2:
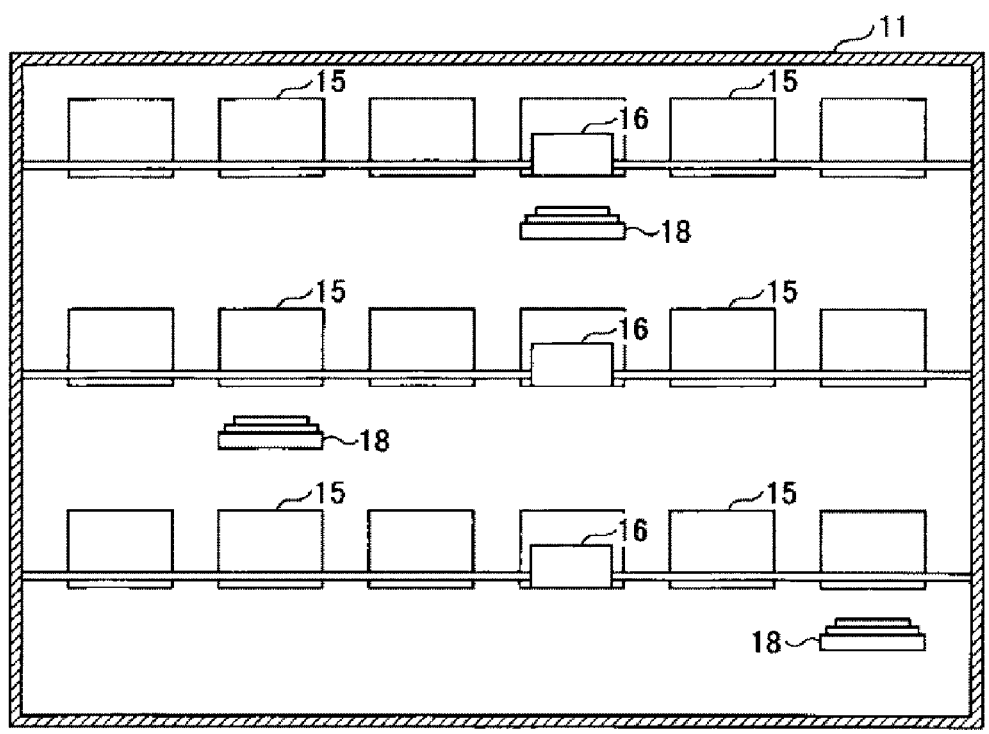
FIG. 2 is another schematic view of the substrate inspection apparatus according to the embodiment of the present disclosure.

FIGS. 1 and 2 are schematic views of a substrate inspection apparatus according to an embodiment of the present disclosure. FIG. 1 shows a horizontal section of the substrate inspection apparatus and FIG. 2 shows a section taken along dashed line 1A-1B in FIG. 1.

As shown in FIGS. 1 and 2, a substrate inspection apparatus 10 includes an inspection room 11. The inspection room 11 has an inspection area 12, a loading/unloading area 13, and a transfer area 14.

The inspection area 12 is an area where electrical characteristics of semiconductor devices formed on a wafer W are inspected. Testers 15 as a plurality of wafer inspection interfaces are arranged in the inspection area 12. Specifically, the inspection area 12 has a multi-stage structure, for example, a three-stage structure, of tester rows composed of a plurality of testers 15 arranged horizontally. One tester side camera 16 is disposed correspondingly to each of the tester rows. Each tester side camera 16 moves horizontally along the corresponding tester row to face the respective testers 15 constituting the tester row, and checks a position of the wafer W carried by a transfer stage 18 and a degree of tilt of a chuck top 50 to be described later.

The loading/unloading area 13 is an area where the wafer W is loaded into and unloaded from the inspection room 11. The loading/unloading area 13 is partitioned into a plurality of accommodation spaces 17. A port 17a, an aligner 17b, a loader 17c, and a controller 17d are disposed in each of the accommodation spaces 17. The port 17a receives a FOUP which is a container for accommodating a plurality of wafers W. The aligner 17b performs a position alignment of the wafers W. The loader 17c performs loading and unloading of a probe card. The controller 17d controls operation of respective components of the substrate inspection apparatus 10.

The transfer area 14 is an area interposed between the inspection area 12 and the loading/unloading area 13. The transfer stage 18, which can be moved in the transfer area 14 and also moved to the inspection area 12 and the loading/unloading area 13, is disposed in the transfer area 14. One transfer stage 18 is installed correspondingly to each stage row. The transfer stage 18 receives a wafer W from the port 17a of the loading/unloading area 13 and transfers the wafer W to each tester 15. Further, the transfer stage 18 transfers a wafer W, for which electrical characteristics of the semiconductor devices have been inspected, from each tester 15 to the port 17a.

In the substrate inspection apparatus 10, each tester 15 can inspect the electrical characteristics of each semiconductor device of the transferred wafer W, in such a way that, while the transfer stage 18 is transferring a wafer W toward one tester 15, another tester 15 inspects the electrical characteristics of each semiconductor device of another wafer W. This can contribute to improvement of inspection efficiency of the wafers W.

Figure 3:
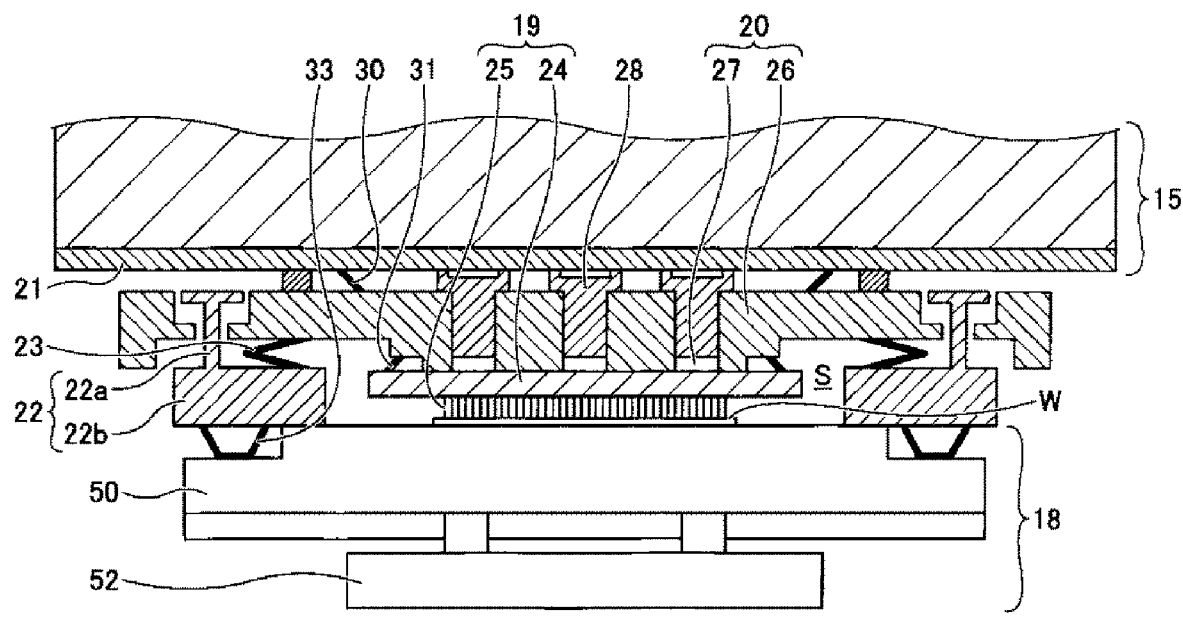
FIG. 3 is an explanatory view of a tester and a transfer stage of the substrate inspection apparatus.

FIG. 3 is an explanatory view of a tester and a transfer stage of the substrate inspection apparatus. FIG. 3 shows a state in which the transfer stage 18 brings a wafer W into contact with a probe card 19 of the tester 15.

As shown in FIG. 3, the tester 15 is installed on a pogo frame 20 fixed to a device frame (not shown). The probe card 19 is attached to a lower part of the pogo frame 20. A flange 22 movable in a vertical direction with respect to the pogo frame 20 is engaged with the pogo frame 20. A cylindrical bellows 23 is interposed between the pogo frame 20 and the flange 22.

The probe card 19 includes a disc-like main body 24, a number of electrodes (not shown) arranged on substantially the entire upper surface of the main body 24, and a number of contact probes 25 (contact terminals) protruding downward in the drawing from the lower surface of the main body 24. Each electrode is connected to a corresponding one of the contact probes 25. When the wafer W is in contact with the probe card 19, each of the contact probes 25 is brought into electrical contact with an electrode pad or a solder bump of each semiconductor device formed on the wafer W. The contact probes 25 are configured to be brought into batch contact with the entire surface of the wafer W, for example. This makes it possible to simultaneously inspect electrical characteristics of a plurality of semiconductor devices, thereby reducing the inspection time.

The pogo frame 20 has a flat plate-like main body 26 and a plurality of pogo block insertion holes 27 which are through-holes formed in the vicinity of a central portion of the main body 26. A pogo block 28, which is formed by arranging a number of pogo pins, is insertedly fit to each of the pogo block insertion holes 27. The pogo block 28 is connected to an inspection circuit (not shown) of the tester 15 and is in contact with the electrodes on the upper surface of the main body 24 of the probe card 19 attached to the pogo frame 20. The pogo block 28 causes an electric current to flow to each of the contact probes 25 of the probe card 19 connected to the electrodes and causes an electric current flowing from an electric circuit of each semiconductor device of the wafer W via each of the contact probes 25 to flow toward the inspection circuit.

The flange 22 has a cylindrical main body 22a and an annular contact member 22b formed below the main body 22a and surrounds the probe card 19. Until the chuck top 50 comes into contact with the flange 22, the flange 22 moves downward by its own weight so that the lower surface of the contact member 22b is positioned lower than the tip end of each contact probe 25 of the probe card 19.

The bellows 23 is a bellows structure made of metal and is configured to be extensible in the vertical direction. The lower end and upper end of the bellows 23 are in close contact with the upper surface of the contact member 22b of the flange 22 and the lower surface of the pogo frame 20, respectively.

In the tester 15, a space between the pogo frame 20 and a base 21 is sealed with a seal member 30. When the space is evacuated, the pogo frame 20 is attached to the base 21. A space between the probe card 19 and the pogo frame 20 is also sealed with a seal member 31. When the space is evacuated, the probe card 19 is attached to the pogo frame 20.

The transfer stage 18 is an example of a substrate mounting table and includes the thick plate-like chuck top 50 and a bottom plate 52. The chuck top 50 is placed on the bottom plate 52 and the wafer W is placed on the top surface of the chuck top 50. The chuck top 50 is vacuum-sucked on the bottom plate 52 and the wafer W is vacuum-sucked on the chuck top 50. Therefore, when the transfer stage 18 moves, it is possible to prevent the wafer W from moving relative to the transfer stage 18. The method of holding the chuck top 50 and the wafer W is not limited to vacuum suction but may be any method such as electromagnetic sucking or clamping as long as it can prevent movement of the chuck top 50 and the wafer W relative to the bottom plate 52. A seal member 33 is disposed on the circumferential portion of the upper surface of the chuck top 50.

The transfer stage 18 is movable. Thus, the transfer stage 18 can move below the probe card 19 of the tester 15 so as to make the wafer W placed on the chuck top 50 face the probe card 19 and can move the wafer W toward the tester 15. When the chuck top 50 makes contact with the contact member 22b of the flange 22 and the wafer W is brought into contact with the probe card 19, a space S surrounded by the probe card 19, the pogo frame 20, the flange 22, and the chuck top 50 is formed. The space S is sealed by the bellows 23 and the sealing member 33. When the space S is evacuated, the chuck top 50 is held on the probe card 19 and the wafer W placed on the chuck top 50 is brought into contact with the probe card 19. At this time, each electrode pad and each solder bump in each semiconductor device of the wafer W are brought into contact with each contact probe 25 of the probe card 19. In the substrate inspection apparatus 10, the movement of the transfer stage 18 is controlled by the controller 17d and the controller 17d grasps the position and movement amount of the transfer stage 18.

However, when an electric current is supplied to the semiconductor devices formed on the wafer W placed on the chuck top 50 via the contact probe 25 to inspect the electrical characteristics of the semiconductor devices, there is a possibility that the wafers W will generate heat. In particular, in a batch contact test for NAND flash memory and DRAM, the heat generation amount of the wafers W is, for example, about 300 W, which is larger as compared with a case where the individual semiconductor devices are sequentially inspected. Therefore, an excessive amount of heat is applied to the wafers W, which may make it difficult to inspect the wafers W at a desired temperature. There is also a market demand for the chuck top 50 with which electrical characteristics of semiconductor devices can be inspected by the batch contact test in a state where a wafer in-plane temperature distribution during heat generation of a wafer is controlled to 2 degrees C. or less.

A chuck top has also been used that absorbs heat generated by the wafers W by using an internal coolant path for circulating a coolant from a central portion to a circumferential portion of the chuck top. However, in some chuck tops, since the coolant path is formed in a spiral shape from the central portion to the circumferential portion, it is likely that the central portion as an upstream side of a coolant flow is cooled further than the circumferential portion as a downstream side of the coolant flow. Therefore, a temperature difference may be generated between the central portion and the circumferential portion of a mounting surface of the chuck top.

In view of the above, the present inventor has carefully studied the above problems, and has found that it is possible to increase an in-plane temperature uniformity by providing a chuck top having a plurality of layers partitioned in a direction perpendicular to a mounting surface of the chuck top and by forming a coolant path on each of at least two of the plurality of layers, the coolant path having an inlet port and an outlet port in the circumferential portion of the corresponding layer. Hereinafter, a transfer stage including a chuck top capable of increasing the in-plane temperature uniformity will be described in detail.

[Transfer Stage]

Figure 4:
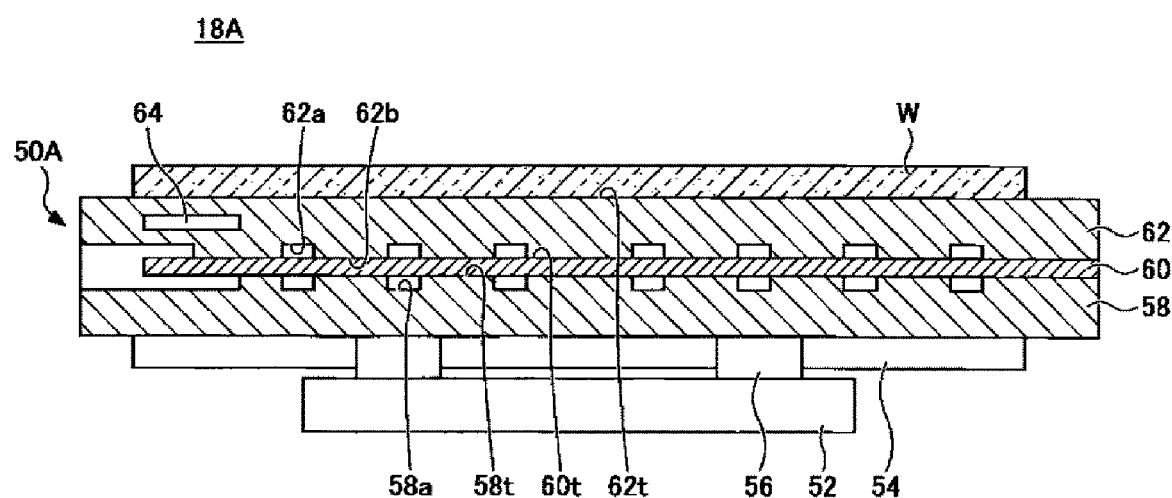
FIG. 4 is a schematic sectional view of a transfer stage of a first configuration example.
Figure 5A:
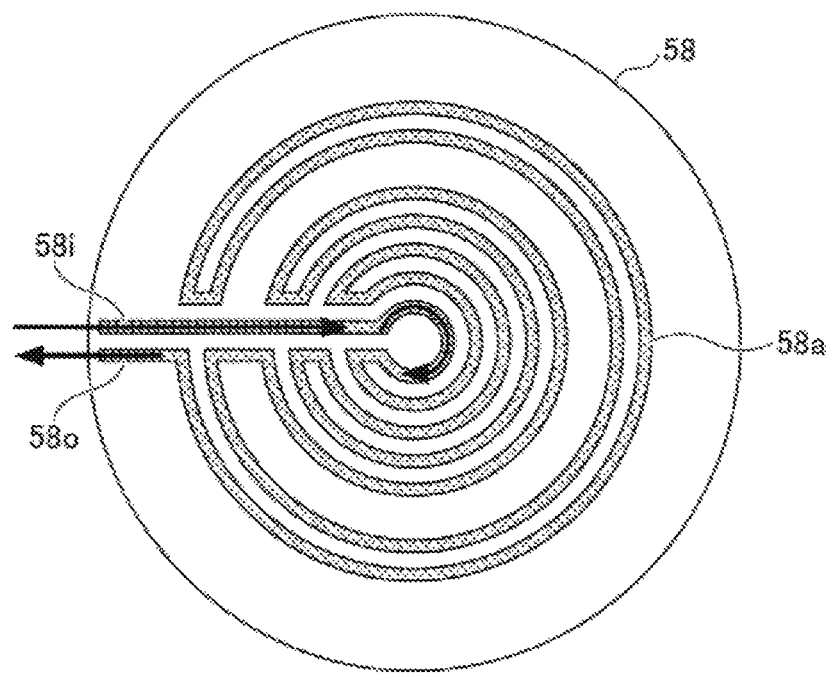
FIGS. 5A and 5B are explanatory views of coolant paths of the transfer stage of FIG. 4.
Figure 5B:
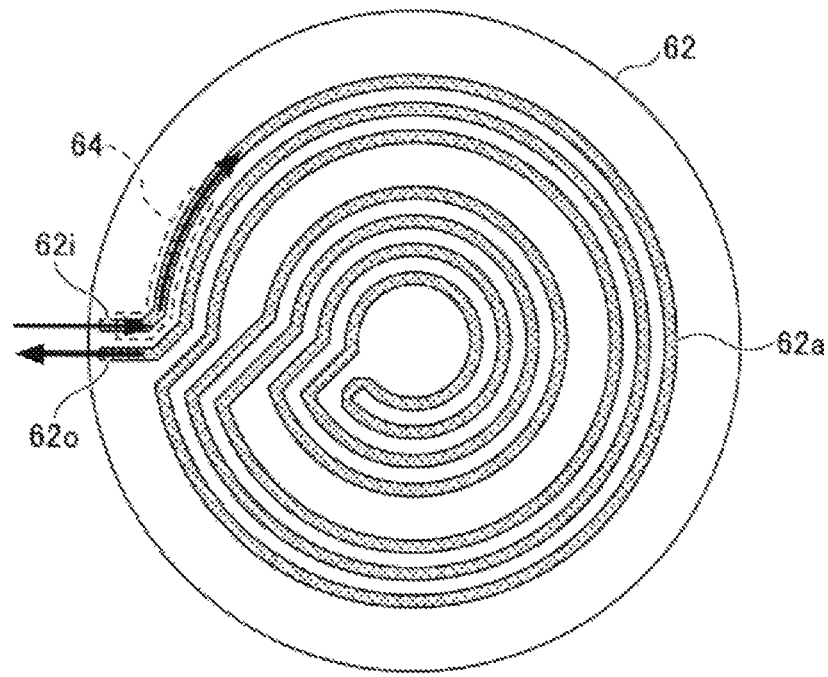

FIG. 4 is a schematic sectional view of a transfer stage of a first configuration example. FIGS. 5A and 5B are explanatory views of coolant paths of the transfer stage of FIG. 4. FIGS. 5A and 5B are explanatory views of coolant paths formed in two of three layers of the transfer stage of FIG. 4, respectively, and schematically show shapes of the coolant paths in a plan view. In FIGS. 5A and 5B, a direction in which a coolant flows is indicated by an arrow.

As shown in FIG. 4, a transfer stage 18A of the first configuration example includes a chuck top 50A, a bottom plate 52, and a heater 54.

The chuck top 50A is installed on the bottom plate 52 via a heat insulating member 56. A wafer W is placed on the upper surface of the chuck top 50A. The chuck top 50A has a plurality of layers partitioned in a direction perpendicular to the upper surface. In the example of FIG. 4, the chuck top 50A has three layers including a lower plate-like member 58, an intermediate plate 60, and an upper plate-like member 62. A coolant path is formed in each of the lower plate-like member 58 and the upper plate-like member 62.

The lower plate-like member 58 is installed on the bottom plate 52 via the heat insulating member 56. The lower plate-like member 58 has a disk shape and is made of a heat conductive material such as copper (Cu), aluminum (Al), or the like. A groove portion 58a is formed on the upper surface 58t of the lower plate-like member 58. The depth of the groove portion 58a may be, for example, 2 mm. As shown in FIG. 5A, for example, the groove portion 58a extends linearly from the circumferential portion to the central portion of the lower plate-like member 58 and extends curvedly from the central portion to the circumferential portion of the lower plate-like member 58. By metal-bonding the intermediate plate 60 to the upper surface 58t of the lower plate-like member 58, the groove portion 58a functions as a coolant path. A coolant is supplied to the coolant path from an inlet port 58i formed in the circumferential portion of the lower plate-like member 58. The coolant path includes a flow path for causing the coolant to flow from the central portion to the circumferential portion. The coolant flowing from the central portion to the circumferential portion flows toward an outlet port 58o formed on the circumferential portion while absorbing heat transferred from the wafer W to the chuck top 50A. Therefore, the temperature of the circumferential portion, which is the downstream side of the coolant flow, is higher than the temperature of the central portion which is the upstream side of the coolant flow. The kind of coolant is not particularly limited but may be, for example, a gas such as nitrogen or air, or a liquid such as water, oil, an aqueous solution of ethylene glycol, or a fluorine-based liquid.

The intermediate plate 60 is metal-bonded to the upper surface 58t of the lower plate-like member 58. The intermediate plate 60 functions as a groove cover of the groove portion 58a. The intermediate plate 60 has a disk shape having substantially the same diameter as the lower plate-like member 58 and is made of a heat conductive material such as Cu, Al, or the like. The thickness of the intermediate plate 60 may be, for example, 1 mm.

Figure 6:
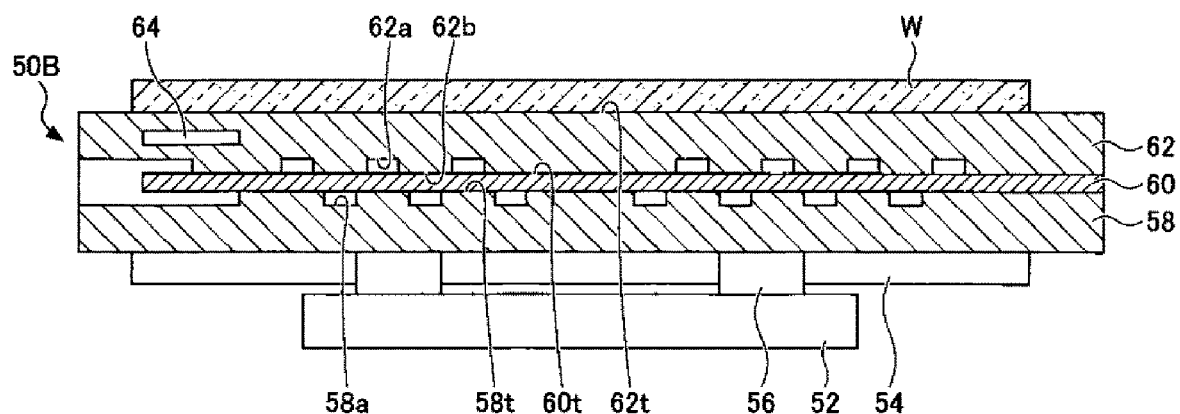
FIG. 6 is a schematic sectional view of a transfer stage of a second configuration example.

The upper plate-like member 62 is metal-bonded to an upper surface 60t of the intermediate plate 60. The upper plate-like member 62 has a disk shape having substantially the same diameter as the lower plate-like member 58 and is made of a heat conductive material such as Cu, Al, or the like. The wafer W is mounted on an upper surface 62t of the upper plate-like member 62. That is to say, the upper surface 62t of the upper plate-like member 62 functions as a mounting surface. A groove portion 62a is formed on a lower surface 62b of the upper plate-like member 62 at a position overlapping the position where the groove portion 58a of the lower plate-like member 58 when viewed from the direction perpendicular to the mounting surface. The positional relationship between the groove portion 58a and the groove portion 62a is not limited thereto. FIG. 6 is a schematic sectional view of a transfer stage 18B of a second configuration example. As shown in FIG. 6, the groove portion 62a may be formed at a position not overlapping the position of the groove portion 58a when viewed from the direction perpendicular to the mounting surface. When the groove portion 62a is formed at a position not overlapping the groove portion 58a, the strength of a chuck top 50B is enhanced. Therefore, in some embodiments when strength is needed, the groove portion 62a and the groove portion 58a may be formed at positions not overlapping with each other when viewed from the direction perpendicular to the mounting surface. The depth of the groove portion 62a may be, for example, 2 mm. As shown in FIG. 5B, for example, the groove portion 62a extends curvedly (spirally) from the circumferential portion toward the central portion of the upper plate-like member 62, is folded back at the central portion, and extends curvedly (spirally) from the central portion toward the circumferential portion of the upper plate-like member 62. By metal-bonding the intermediate plate 60 to the lower surface 62b of the upper plate-like member 62, the groove portion 62a functions as a coolant path. A coolant is supplied to the coolant path from an inlet port 62i formed in the circumferential portion of the upper plate-like member 62. The coolant path includes a flow path for causing the coolant to flow from the circumferential portion to the central portion. The coolant flowing from the circumferential portion to the central portion flows to the central portion while absorbing heat transferred from the wafer W to the chuck top 50B and then flows toward an outlet port 62o formed in the circumferential portion. Therefore, the temperature of the central portion, which is the downstream side of the coolant flow, is higher than the temperature of the circumferential portion which is the upstream side of the coolant flow. The kind of coolant is not particularly limited but may be the same as the coolant supplied to the coolant flow path of the lower plate-like member 58, for example.

As described above, the chuck top 50A has a coolant path, which has an inlet port and an outlet port in the circumferential portion, on each of two of three layers partitioned in a direction perpendicular to the mounting surface. With this configuration, the area where heat exchange occurs between the chuck top 50A to which the heat is transferred from the wafer W and the coolant can be increased so that the heat absorption efficiency is enhanced.

The coolant flows from the circumferential portion toward the central portion in one of the two layers and flows from the central portion toward the circumferential portion in the other layer. With this configuration, the in-plane temperature distributions in the two layers cancel out each other. Therefore, the temperature difference between the central portion and the circumferential portion of the chuck top 50A is reduced. As a result, it is possible to enhance the in-plane temperature uniformity in the chuck top 50A.

In some embodiments, the inlet ports 58i and 62i of the coolant paths formed in the lower plate-like member 58 and the upper plate-like member 62, respectively, may be in communication with each other. With this configuration, a coolant can be supplied from one coolant supply source such as a chiller to two coolant paths. As a result, it is possible to reduce cost for introducing the coolant supply source.

In some embodiments, the lengths, widths, heights, and shapes of the groove portions 58a 62a may be determined so that the conductance of the coolant path formed in the upper plate-like member 62 and the conductance of the coolant path formed in the lower plate-like member 58 become equal to each other. With this configuration, the flow rate of the coolant flowing in the coolant path formed in the upper plate-like member 62 and the flow rate of the coolant flowing in the coolant path formed in the lower plate-like member 58 can be equal to each other. As a result, it is possible to form unbiased coolant flows.

In some embodiments, a heat insulating space portion 64 having a lower thermal conductivity than that of a heat conductive member forming the upper plate-like member 62 may be formed at a position located on the circumferential portion of the upper plate-like member 62 and overlapping with the groove portion 62a when viewed from the direction perpendicular to the upper surface 62t of the upper plate-like member 62. With this configuration, overcooling in the vicinity of the inlet port of the coolant path is suppressed to enhance the heat uniformity. The heat insulating space portion 64 may be, for example, a hollow or a structure filled with a heat insulating member. In a plan view, the heat insulating space portion 64 has a shape along the coolant path in the circumferential portion of the upper plate-like member 62, as shown in FIG. 5B, for example.

The bottom plate 52 holds the chuck top 50A via the heat insulating member 56. The bottom plate 52 has, for example, a disk shape.

The heater 54 is attached to the lower surface of the lower plate-like member 58. The heater 54 heats the wafer W via the chuck top 50A (the lower plate-like member 58, the intermediate plate 60, and the upper plate-like member 62). With this configuration, in addition to the temperature control by the coolant flowing through the coolant path, it is possible to perform a temperature control by the heater 54. Further, by adopting the structure in which the heater 54 is attached to the lower surface of the chuck top 50A, it is possible to heat the chuck top 50A as a whole in a state where the in-plane temperature uniformity in the chuck top 50A is enhanced by the coolant. Therefore, it is possible to perform a temperature control of the chuck top 50A toward a high temperature side while suppressing the influence of the heater on the in-plane temperature uniformity of the chuck top 50A.

Figure 7:
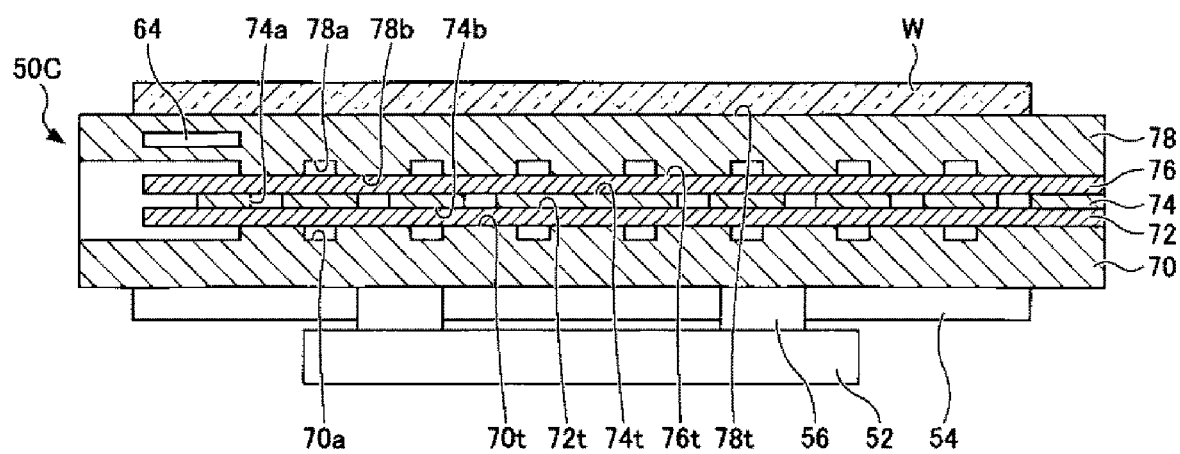
FIG. 7 is a schematic sectional view of a transfer stage of a third configuration example.
Figure 8A:
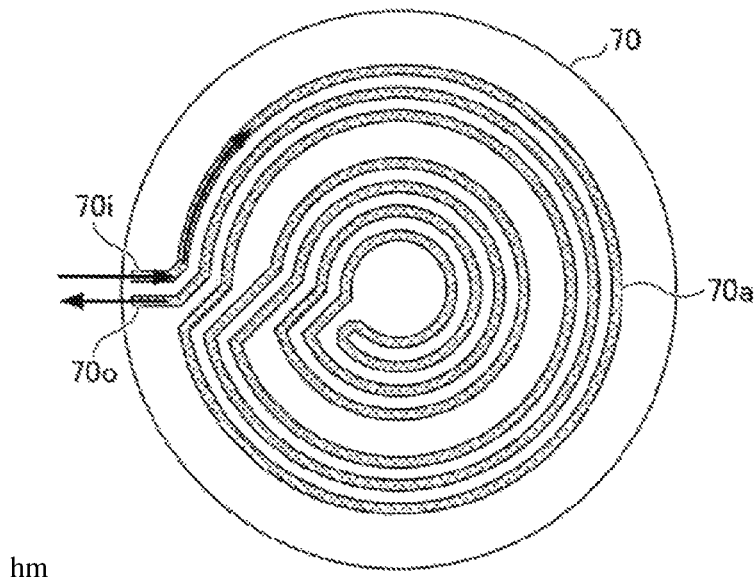
FIGS. 8A to 8C are explanatory views of coolant paths of the transfer stage of FIG. 7.
Figure 8B:
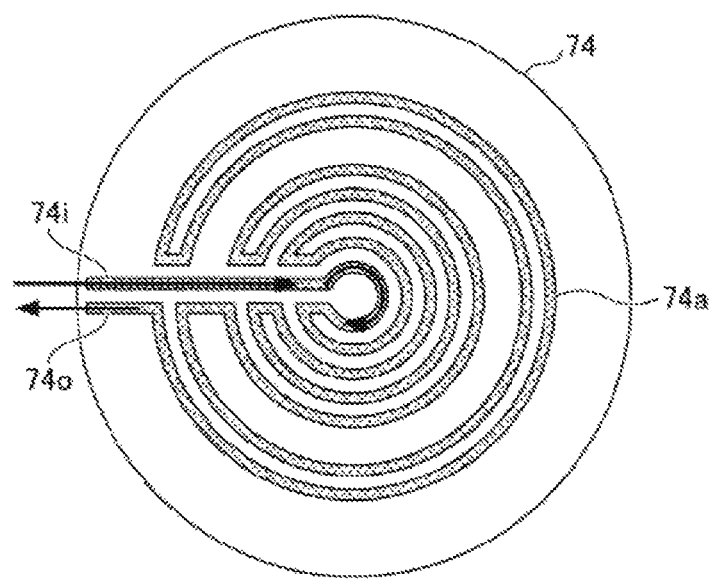
Figure 8C:
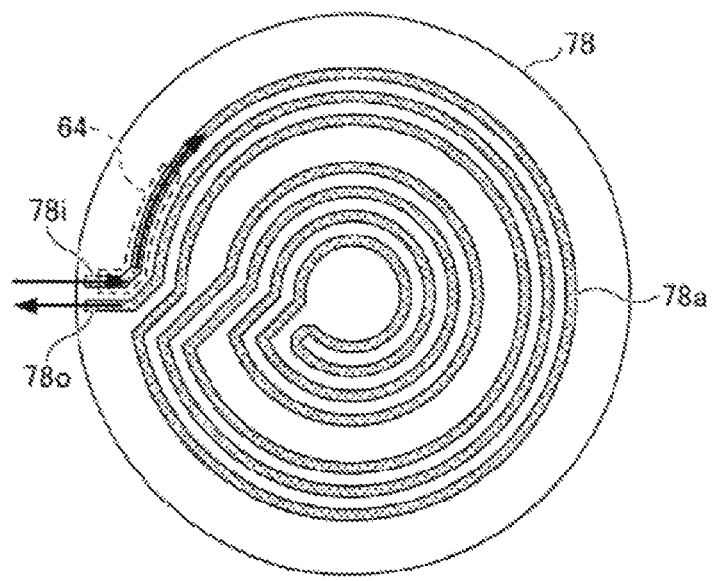

FIG. 7 is a schematic sectional view of a transfer stage of a third configuration example. FIGS. 8A to 8C are explanatory views of coolant paths of the transfer stage of FIG. 7. FIGS. 8A, to 8C are explanatory views of coolant paths formed in three of five layers of the transfer stage of FIG. 7, respectively, and schematically show shapes of the coolant paths in a plan view. In FIGS. 8A to 8C, a direction in which a coolant flows is indicated by an arrow.

As shown in FIG. 7, a transfer stage 18C of the third configuration example is different from the transfer stage 18A of the first configuration example in that a chuck top 50C includes five layers (a lower plate-like member 70, a first intermediate plate 72, a middle plate-like member 74, a second intermediate plate 76, and an upper plate-like member 78). In addition, in the transfer stage 18C of the third configuration example, a coolant path is formed in each of three layers including the lower plate-like member 70, the middle plate-like member 74, and the upper plate-like member 78.

The lower plate-like member 70 is installed on the bottom plate 52 via the heat insulating member 56. The lower plate-like member 70 has a disk shape and is made of a heat conductive material such as Cu, Al, or the like. A groove portion 70a is formed on an upper surface 70t of the lower plate-like member 70. The depth of the groove portion 70a may be, for example, 2 mm. As shown in FIG. 8A, for example, the groove portion 70a extends curvedly (spirally) from the circumferential portion toward the central portion of the lower plate-like member 70, is folded back at the central portion, and extends curvedly (spirally) from the central portion toward the circumferential portion of the lower plate-like member 70. By metal-bonding the first intermediate plate 72 to the upper surface 70t of the lower plate-like member 70, the groove portion 70a functions as a coolant path. A coolant is supplied to the coolant path from an inlet port 70i formed in the circumferential portion of the lower plate-like member 70. The coolant path includes a flow path for causing the coolant to flow from the circumferential portion toward the central portion. The coolant flowing from the circumferential portion to the central portion flows to the central portion while absorbing heat generated from the wafer W and then flows toward an outlet port 70o formed in the circumferential portion. Therefore, the temperature of the central portion, which is the downstream side of the coolant flow, is higher than the temperature of the circumferential portion which is the upstream side of the coolant flow. The kind of coolant is not particularly limited but may be, for example, a gas such as nitrogen or air, or a liquid such as water, oil, an aqueous solution of ethylene glycol, or a fluorine-based liquid.

The first intermediate plate 72 is metal-bonded to the upper surface 70t of the lower plate-like member 70. The first intermediate plate 72 functions as a groove cover of the groove portion 70a and a groove portion 74a. The first intermediate plate 72 has a disk shape having substantially the same diameter as the lower plate-like member 70 and is made of a heat conductive material such as Cu, Al, or the like. The thickness of the first intermediate plate 72 may be, for example, 1 mm.

The middle plate-like member 74 is metal-bonded to an upper surface 72t of the first intermediate plate 72. The middle plate-like member 74 has a disk shape having substantially the same diameter as the lower plate-like member 70 and is made of a heat conductive material such as Cu, Al, or the like. The groove portion 74a is formed on the middle plate-like member 74 at a position not overlapping the position where the groove portion 70a of the lower plate-like member 70 is formed when viewed from the direction perpendicular to the mounting surface. The positional relationship between the groove portion 70a and the groove portion 74a is not limited thereto, but the groove portion 74a may be formed at a position overlapping with the position of the groove portion 70a when viewed from the direction perpendicular to the mounting surface. However, when the groove portion 74a is formed at the position not overlapping the groove portion 70a, the strength of the chuck top 50C is enhanced. Therefore, in some embodiments when strength is required, the groove portion 70a and the groove portion 74a may be formed at positions not overlapping with each other when viewed from the direction perpendicular to the mounting surface. The depth of the groove portion 74a may be, for example, 2 mm. As shown in FIG. 8B, for example, the groove portion 74a extends linearly from the circumferential portion to the central portion of the middle plate-like member 74 and extends curvedly from the central portion toward the circumferential portion of the middle plate-like member 74. By metal-boding the first intermediate plate 72 to a lower surface 74b of the middle plate-like member 74 and by metal-bonding the second intermediate plate 76 to an upper surface 74t of the middle plate-like member 74, the groove portion 74a functions as a coolant path. A coolant is supplied to the coolant path from an inlet port 74i formed in the circumferential portion of the middle plate-like member 74. The coolant path includes a flow path for causing the coolant to flow from the central portion to the circumferential portion. The coolant flowing from the central portion to the circumferential portion flows toward an outlet port 74o formed in the circumferential portion while absorbing heat generated from the wafer W. Therefore, the temperature of the circumferential portion, which is the downstream side of the coolant flow, is higher than the temperature of the central portion which is the upstream side of the coolant flow. The kind of coolant is not particularly limited but may be the same as the coolant supplied to the coolant path of the lower plate-like member 70, for example.

The second intermediate plate 76 is metal-bonded to the upper surface 74t of the middle plate-like member 74. The second intermediate plate 76 functions as a groove cover of the groove portion 74a and a groove portion 78a. The second intermediate plate 76 has a disk shape having substantially the same diameter as the lower plate-like member 70 and is made of a heat conductive material such as Cu, Al, or the like. The thickness of the second intermediate plate 76 may be, for example, 1 mm.

The upper plate-like member 78 is metal-bonded to an upper surface 76t of the second intermediate plate 76. The upper plate-like member 78 has a disk shape having substantially the same diameter as the lower plate-like member 70 and is made of a heat conductive material such as Cu, Al, or the like. The wafer W is mounted on an upper surface 78t of the upper plate-like member 78. That is to say, the upper surface 78t of the upper plate-like member 78 functions as a mounting surface. The groove portion 78a is formed on a lower surface 78b of the upper plate-like member 78 at a position overlapping the position where the groove portion 70a of the lower plate-like member 70 is formed when viewed from the direction perpendicular to the mounting surface. The positional relationship between the groove portion 70a and the groove portion 78a is not limited thereto, but the groove portion 78a may be formed at a position not overlapping with the position of the groove portion 70a when viewed from the direction perpendicular to the mounting surface. When the groove portion 78a is formed at the position not overlapping the groove portion 70a, the strength of the chuck top 50C is enhanced. Therefore, in some cases when strength is needed, the groove portion 70a and the groove portion 78a may be formed at positions not overlapping with each other when viewed from the direction perpendicular to the mounting surface. The depth of the groove portion 78a may be, for example, 2 mm. The groove portion 78a extends curvedly (spirally) from the circumferential portion toward the central portion of the upper plate-like member 78, is folded back at the central portion, and extends curvedly (spirally) from the central portion toward the circumferential portion of the upper plate-like member 78. By metal-bonding the second intermediate plate 76 to the lower surface 78b of the upper plate-like member 78, the groove portion 78a functions as a refrigerant flow path. A coolant is supplied to the coolant path from an inlet port 78i formed in the circumferential portion of the upper plate-like member 78. The coolant path includes a flow path for causing the coolant to flow from the circumferential portion to the central portion. The coolant flowing from the circumferential portion toward the central portion flows to the central portion while absorbing heat generated from the wafer W and then flows toward an outlet port 78o formed in the circumferential portion. Therefore, the temperature of the central portion, which is the downstream side of the coolant flow, is higher than the temperature of the circumferential portion which is the upstream side of the coolant flow. The kind of coolant is not particularly limited but may be the same as the coolant supplied to the coolant path of the lower plate-like member 70, for example.

As described above, the chuck top 50C has a coolant path, which has an inlet port and an outlet port in the circumferential portion, on each of three of five layers partitioned in a direction perpendicular to the mounting surface. With this configuration, the area where heat exchange occurs between the chuck top 50C to which the heat is transferred from the wafer W and the coolant can be further increased than the first configuration example, so that the heat absorption efficiency is further enhanced.

The coolant flows from the circumferential portion toward the central portion in two of the three layers and flows from the central portion toward the circumferential portion in the remaining one layer. With this configuration, the in-plane temperature distributions in the three layers cancel out one another. Therefore, the temperature difference between the central portion and the circumferential portion of the chuck top 50C is reduced. As a result, it is possible to enhance the in-plane temperature uniformity in the chuck top 50C.

In some embodiments, the inlet ports 70$i$, 74$i$, and 78$i$ of the coolant paths formed in the lower plate-like member 70, the middle plate-like member 74, and the upper plate-like member 78, respectively, may be in communication with one another. With this configuration, a coolant can be supplied from one coolant supply source such as a chiller to the coolant paths formed in the lower plate-like member 70, the middle plate-like member 74, and the upper plate-like member 78. As a result, it is possible to reduce cost for introducing the coolant supply source.

In some embodiments, the lengths, widths, heights, and shapes of the groove portions 70$a$, 74$a$, and 78$a$ may be determined so that the conductances of the coolant paths formed in the lower plate-like member 70, the middle plate-like member 74, and the upper plate-like member 78 become equal to one another. With this configuration, the flow rates of the coolants flowing in the coolant paths formed in the lower plate-like member 70, the middle plate-like member 74, and the upper plate-like member 78 can be equal to one another. As a result, it is possible to form unbiased coolant flows.

In some embodiments, a heat insulating space portion 64 having a lower thermal conductivity than that of a heat conductive member forming the upper plate-like member 78 is formed at a position located on the circumferential portion of the upper plate-like member 78 and overlapping with the groove portion 78$a$ (coolant path) when viewed from the direction perpendicular to the upper surface 78$t$ of the upper plate-like member 78. The heat insulating space portion 64 may be, for example, a hollow or a structure filled with a heat insulating member. In a plan view, the heat insulating space portion 64 may have a shape along the coolant path in the circumferential portion of the upper plate-like member 78, as shown in FIG. 8C, for example. With this configuration, overcooling in the vicinity of the inlet port of the coolant path can be suppressed. As a result, the in-plane temperature uniformity can be particularly enhanced.

The bottom plate 52 holds the chuck top 50C via the heat insulating member 56. The bottom plate 52 has, for example, a disk shape.

The heater 54 is attached to the lower surface of the lower plate-like member 70. The heater 54 heats the wafer W via the chuck top 50C (the lower plate-like member 70, the first intermediate plate 72, the middle plate-like member 74, the second intermediate plate 76, and the upper plate-like member 78). With this configuration, in addition to a temperature control by the coolant flowing through the coolant path, it is possible to perform a temperature control by the heater 54. Further, by adopting the structure in which the heater 54 is attached to the lower surface of the chuck top 50C, it is possible to heat the chuck top 50C as a whole in a state where the in-plane temperature uniformity in the chuck top 50C is enhanced by the coolant. Therefore, it is possible to perform a temperature control of the chuck top 50C toward a high temperature side while suppressing the influence of the heater on the in-plane temperature uniformity of the chuck top 50C.

[Method of Manufacturing Chuck Top]

Figure 9:
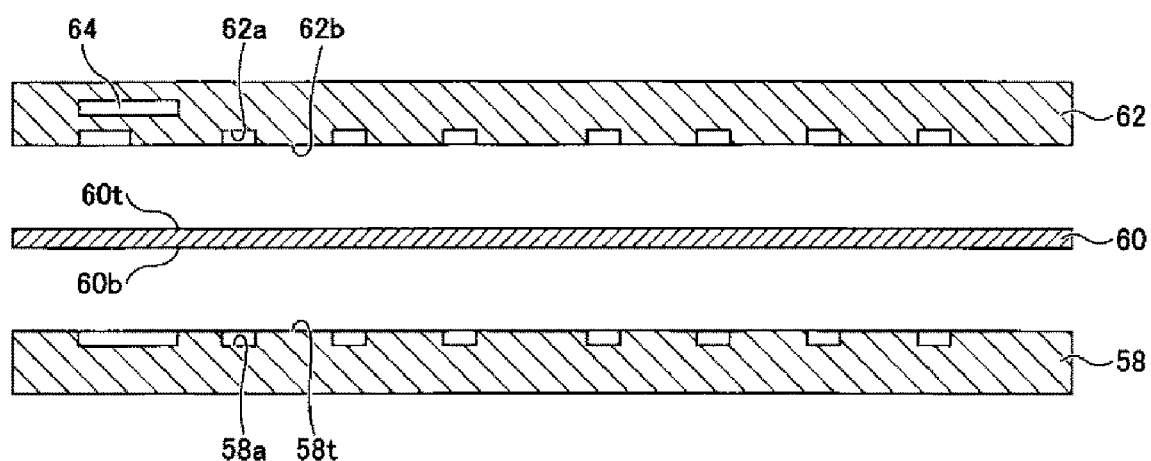
FIG. 9 is an explanatory view of a method of manufacturing a chuck top of the transfer stage of the first configuration example.

A method of manufacturing a chuck top will be described with an example of manufacturing the chuck top 50A of the transfer stage 18A of the first configuration example. FIG. 9 is an explanatory view of a method of manufacturing the chuck top 50A of the transfer stage 18A of the first configuration example.

First, the lower plate-like member 58 having the groove portion 58$a$ extending from the circumferential portion, the upper plate-like member 62 having the groove portion 62$a$ extending from the circumferential portion and the heat insulating space portion 64, and the intermediate plate 60 are formed.

Subsequently, the upper surface 58$t$ of the lower plate-like member 58 and the lower surface 60$b$ of the intermediate plate 60 are bonded to each other by metal bonding such as brazing or diffusion bonding so as to form a coolant path surrounded by the groove portion 58$a$ and the lower surface 60$b$ of the intermediate plate 60. Further, the lower surface 62$b$ of the upper plate-like member 62 and the upper surface 60$t$ of the intermediate plate 60 are bonded to each other by metal bonding such as brazing or diffusion bonding so as to form a coolant path surrounded by the groove portion 62$a$ and the upper surface 60$t$ of the intermediate plate.

Through the above steps, the chuck top 50A having the coolant paths formed in two (the lower plate-like member 58 and the upper plate-like member 62) of the three layers (the lower plate-like member 58, the intermediate plate 60, and the upper plate-like member 62) can be manufactured. In the method of manufacturing the chuck top 50A according to the embodiment of the present disclosure, since the three layers are bonded to one another by metal boding such as brazing or diffusion bonding, the processing cost does not increase particularly.

[Simulation Results]

In Example 1, a chuck top having a plate-like member in which a coolant path (see FIG. 5A) extending curvedly from the central portion toward the circumferential portion is formed and a plate-like member in which a coolant path (see FIG. 5B) extending curvedly from the circumferential portion toward the central portion is formed was used. A wafer having a heat generation amount of 300 W was mounted on the mounting surface of the chuck top. The temperature of the mounting surface when a coolant having a liquid temperature of −40 degrees C. was supplied to the coolant paths at a flow rate of 4 L/min was obtained by simulation.

In Example 2, a chuck top, which has a heat insulating space portion (see FIG. 4) formed at a position overlapping with the circumferential portion of a coolant path extending curvedly from the circumferential portion to the central portion when viewed from a direction perpendicular to the mounting surface of the chuck top, in addition to the configuration of Example 1, was used. A wafer W having a heat generation amount of 300 W was mounted on the mounting surface of the chuck top. The temperature of the mounting surface when a coolant having a liquid temperature of −40 degrees C. was supplied to the coolant path at a flow rate of 4 L/min was obtained by simulation.

In Comparative Example 1, a chuck top having a plate-like member in which a coolant path (see FIG. 5B) extending curvedly from the circumferential portion toward the central portion is formed was used. A wafer having a heat generation amount of 300 W was mounted on the mounting surface of the chuck top. The temperature of the mounting surface when a coolant having a liquid temperature of −40 degrees C. was supplied to the coolant path at a flow rate of 4 L/min was obtained by simulation.

FIG. 10 shows simulation results of the in-plane temperature distribution of the mounting surface. In FIG. 10, temperatures of the mounting surfaces when the chuck tops of Example 1, Example 2, and Comparative Example 1 were used, respectively, are shown in order from the left side.

It can be seen from FIG. 10 that the in-plane temperature uniformity of the mounting surface is better in the chuck tops of Examples 1 and 2 than in the chuck top of Comparative Example 1. More specifically, the in-plane temperature difference $\Delta T$ of the mounting surface was 1.7 degrees C. in Example 1 and the in-plane temperature difference $\Delta T$ of the mounting surface was 1.3 degrees C. in Example 2, achieving good in-plane temperature uniformity of the mounting surface, i.e., $\Delta T<2$ degrees C. In contrast, in Comparative Example 1, the in-plane temperature difference $\Delta T$ of the mounting surface was 2.6 degrees C., which is larger than those in Examples 1 and 2.

According to the present disclosure in some embodiments, it is possible to provide a substrate mounting table which is capable of enhancing the in-plane temperature uniformity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate mounting table that is used for an electrical characteristics inspection of a semiconductor device formed on a substrate, the substrate mounting table comprising:
a plurality of layers partitioned in a direction perpendicular to a mounting surface on which the substrate is mounted,
wherein coolant paths are formed on at least two layers among the plurality of layers, each of the coolant paths having an inlet port and an outlet port located in a circumferential portion of a corresponding one of the at least two layers.

2. The substrate mounting table of claim 1, wherein conductances of the coolant paths formed on the at least two layers are equal to each other.

3. The substrate mounting table of claim 1, wherein the coolant paths formed on the at least two layers include:
at least one first flow path extending curvedly from the circumferential portion of the corresponding one of the at least two layers to a central portion of the corresponding one of the at least two layers; and
at least one second flow path curvedly extending from the central portion of the corresponding one of the at least two layers to the circumferential portion of the corresponding one of the at least two layers.

4. The substrate mounting table of claim 1, further comprising:
a heat insulating space portion that overlaps with the inlet port when viewed from the direction perpendicular to the mounting surface and is made of a material having a lower thermal conductivity than a material of which the plurality of layers is made.

5. The substrate mounting table of claim 1, further comprising:
a heater configured to heat the substrate via the plurality of layers.

6. The substrate mounting table of claim 1, wherein the plurality of layers is metal-bonded to one another.

7. The substrate mounting table of claim 1, wherein the inlet ports of the coolant paths formed on the at least two layers are in communication with one another.

8. A substrate inspection apparatus that inspects electrical characteristics of a semiconductor device formed on a substrate, the apparatus comprising:
a substrate mounting table on which the substrate is mounted; and
a probe card facing a mounting surface of the substrate mounting table, on which the substrate is mounted, the probe card having a plurality of probes configured to be in an electrical contact with the semiconductor device,
wherein the substrate mounting table includes a plurality of layers partitioned in a direction perpendicular to the mounting surface, and
wherein coolant paths are formed on at least two layers among the plurality of layers, each of the coolant paths having an inlet port and an outlet port located in a circumferential portion of a corresponding one of the at least two layers.

* * * * *